United States Patent
Inoue

(10) Patent No.: US 9,627,065 B2
(45) Date of Patent: Apr. 18, 2017

(54) MEMORY EQUIPPED WITH INFORMATION RETRIEVAL FUNCTION, METHOD FOR USING SAME, DEVICE, AND INFORMATION PROCESSING METHOD

(71) Applicant: Katsumi Inoue, Chiba (JP)

(72) Inventor: Katsumi Inoue, Chiba (JP)

( * ) Notice: Subject to any disclaimer, the term of this patent is extended or adjusted under 35 U.S.C. 154(b) by 0 days.

(21) Appl. No.: 15/107,565

(22) PCT Filed: Dec. 18, 2014

(86) PCT No.: PCT/JP2014/083607
§ 371 (c)(1),
(2) Date: Jun. 23, 2016

(87) PCT Pub. No.: WO2015/098707
PCT Pub. Date: Jul. 2, 2015

(65) Prior Publication Data
US 2016/0322105 A1  Nov. 3, 2016

(30) Foreign Application Priority Data
Dec. 23, 2013  (JP) .................................. 2013-264763

(51) Int. Cl.
*G11C 15/04* (2006.01)
*G06F 17/30* (2006.01)
*G11C 15/00* (2006.01)
*G10L 15/28* (2013.01)

(52) U.S. Cl.
CPC .............. *G11C 15/04* (2013.01); *G06F 17/30* (2013.01); *G11C 15/00* (2013.01); *G10L 15/28* (2013.01)

(58) Field of Classification Search
CPC ......... G11C 15/04; G11C 15/00; G06F 17/30; G10L 15/28
See application file for complete search history.

(56) References Cited

U.S. PATENT DOCUMENTS

2012/0324204 A1  12/2012  Inoue
2015/0154317 A1  6/2015  Inoue

FOREIGN PATENT DOCUMENTS

| JP | 01-297724 A | 11/1989 |
|---|---|---|
| JP | 2000-067573 A | 3/2000 |
| JP | 2012-252368 | 12/2012 |
| WO | 2011-102432 A1 | 8/2011 |
| WO | 2013-147022 A1 | 3/2013 |

OTHER PUBLICATIONS

International Search Report of PCT/JP2014/083607.
International Preliminary Report on patentability for PCT/JP2014/083607.

*Primary Examiner* — Richard Elms
*Assistant Examiner* — Ajay Ojha
(74) *Attorney, Agent, or Firm* — Konomi Takeshita

(57) ABSTRACT

CPUs are not effective for search processing for information on a memory. Content-addressable memories (CAMs) are effective for information searches, but it is difficult to build a large-capacity memory usable for big data using the CAMs. A large-capacity memory may be turned into an active memory having an information search capability comparable to that of a content-addressable memory (CAM) by incorporating an extremely small, single-bit-based parallel logical operation unit into a common memory. With this memory, a super fast in-memory database capable of fully parallel searches may be realized.

12 Claims, 7 Drawing Sheets

MEMORY EQUIPPED WITH INFORMATION RETRIEVAL FUNCTION, METHOD FOR USING SAME, DEVICE, AND INFORMATION PROCESSING METHOD

FIELD OF THE INVENTION

The present invention relates to a memory provided with an information search function and the memory's usage, device and information processing method.

BACKGROUND OF THE INVENTION

With massive semiconductor memories becoming available at low prices, in-memory database technologies have become a focus of attention as fast-processing techniques for big data. One of the in-memory database technologies is used in data mining, where an enormous amount of data resides on a semiconductor memory (in-memory database) to speed up data accesses and, therefore, searches for information of interest. However, moving the information data from a hard disk device to a semiconductor memory alone only offers expectation of 1 to 2 orders of speed improvement.

It is necessary to clarify challenges of current von Neumann-architecture computers before considering an essence of big data usage.

In current computers, CPU's do all information processing regardless of whether of not the CPU's are suited for the processing they have to perform. For CPU's, for example, data items are analogous to playing cards with their faces down, and the CPU's have to turn over each card (access each address) when searching for information. When a CPU performs information processing such as one to sequentially search for specific information on a memory, an amount of information processing becomes extremely large, leading to a long overall waiting time. This is the bus bottleneck, an inevitable problem of the von Neumann-architecture computers.

Parallel processing (distributed processing) by each CPU is an attempt to solve these challenges, but complicates peripheral circuits to overly enlarge the system.

Based on such a background, various techniques (software algorithms) have been devised and utilized in order to reduce the CPU load and the number of information processing procedures for the current computers with the bus bottleneck.

For example, representative algorithms utilized for information search include hash table, index, tree structure, binary search and clustering algorithms and, considering their combinations, the number of possible algorithms is practically infinite. These techniques (software algorithms) are merely means for reducing the CPU load and the number of information processing procedures to thereby take full advantage of the CPUs with the above inherent problem. In other words, any of the above algorithms is a method for, for example, organizing types and in-memory locations of information pieces ahead of time, creating headers and their routes so that a CPU can easily find information, arranging data items according to their sizes.

According to such algorithms, the CPU load is reduced during the search, but pre- and post-processing mandates complex information processing. For example, in data insertion or deletion, data rearrangement or reordering is required every time a data item is added or deleted as the pre- and post-processing for these algorithms.

In order to build an optimal system for a particular database, it is necessary to select some of the software algorithms described above according to a type and/or a scale of the database, and this can be done only by experts with appropriate knowledge and experience.

These and other inherent problems of the current computers arise from the fact that the CPU performs all the information processing, but from a different point of view, if the memory can find specific information by itself, the information processing discussed above will totally change.

Content-addressable memories (CAM) exist as a technology to eliminate the above and other problems. However, content-addressable memories (CAMs) have challenges that they each needs a completely parallel comparison circuit which increases their overall circuit size, and that parallel circuits constituting the comparison circuit consume high current. For this reason, utilization of the content-addressable memories (CAMs) has been limited to special applications where super fast search is essential as in communication routers.

Considering the above situation, the purpose of the present invention is to provide a memory with a new concept to enable a big data search at a speed comparable to that of content-addressable memories (CAM) by simply incorporating an extremely small number of circuits into a common memory.

In order to attain the same objective, the present inventor has been devising various inventions. For example, Japanese Patent No. 4588114, "Memory Provided with Information Refinement Detection Function" by the present inventor discloses a memory with a strong capability of logical product operations such as pattern matching. Also, PCT/JP2013/059260 "Memory Provided with Set Operation Function" discloses a memory capable of expanding the concept of the above memory provided with the information refinement detection function to thereby freely enable logical product operations, logical sum operations and logical negation operations, etc. The disclosures of these two applications are incorporated herein by reference in their entirety.

A memory 101 of the present invention may be applied to the above two prior inventions.

Also, Japanese Patent Application No. 10-232531 "Memory with Operation Function" has an objective, as it illustrates, to improve a chip efficiency by providing an operation circuit for each block unit. This reduces the size of operation circuitry compared to providing an operation circuit for each memory, but deteriorates the operation efficiency as well as having a poor chip efficiency and undesirable cost issues.

Memories with an operation function disclosed in other patent publications are similar to this, and there is no prior invention found for performing parallel information processing on data in a memory with a minimum configuration of one set of operation function as the present invention does.

SUMMARY OF THE INVENTION

An object of the invention is to provide a memory provided with an information search function based on a novel information processing concept, applicable to big data and capable of fundamentally eliminating the biggest problem in CPU-based information processing, i.e., information searches, for which information processing is too complex for non-experts and burdensome to CPUs, and complicates peripheral circuits to increase required power consumption.

Specifically, the present memory leverages the concept of content-addressable memory (CAM) capable of parallel information searches, and addresses the CAM's challenges such as its circuit size and high power consumption to thereby provide a memory element applicable to big data and based on a novel concept free from conventional information processing scheme.

In order to overcome the above challenges, the following are provided according to a principal aspect of the present invention.

In claim 1:

A memory capable of reading and writing information, provided with an information search function, (1) wherein the memory has one word bit width of n and N word addresses, that is a storage cell structure of N×n bits, (2) the memory comprising: a logical operation unit having a set of n bits for the entirety of the memory;

(3) a function to enter (substitute) storage cell information having the one word bit width of n into the logical operation unit having the set of n bits, and logically operate the storage cell information, wherein the storage cell information is repeatedly selected/specified from among the N word addresses; and (4) a function to output contents of the logical operation unit.

In claim 2:

The memory provided with the information search function of claim 1, wherein the logical operation unit is configured to be capable of logical storage, logical product, logical sum, logical negation, exclusive logic or any combinatorial operation thereof between single bits of the entered (substituted) memory storage cell information having the one word bit width of n.

In claim 3:

The memory provided with the information search function of claim 1, wherein the logical operation unit is provided with a shift register function.

In claim 4:

The memory provided with the information search function of claim 1, wherein the memory performs an exact match search for a data value and a range search for data values using the logical storage, logical product, logical sum, logical negation, exclusive logic or any combinatorial operation thereof.

In claim 5:

The memory provided with the information search function of claim 1, wherein the memory performs an addition or a subtraction of data values using the logical storage, logical product, logical sum, logical negation, exclusive logic or any combinatorial operation thereof.

In claim 6:

The memory provided with the information search function of claim 1, wherein the memory is integrated with a semiconductor device of another type such as a CPU.

In claim 7:

The memory provided with the information search function of claim 1, wherein the memory is implemented in an FPGA.

In claim 8:

A method for using the memory provided with the information search function of claim 1, comprising the step of assigning a database record to any one of columns within the one word bit width of n to generate a database, wherein a total bit number of fields per record of the database equals the number of word addresses N.

In claim 9:

A method for using the memory provided with the information search function of claim 1, comprising the step of:
connecting for use, memories each provided with the information search function
(1) in series, in parallel or in series and parallel;
(2) hierarchically; or
(1) or (2).

In claim 10:

A device including the memory of claim 1.

In claim 11:

An information processing method comprising the step of repeating logical product, logical sum, logical negation, exclusive logic or any combinatorial logical operation thereof between single bits of the memory storage cell information within the memory to thereby obtain a prescribed operation result.

In claim 12:

The information processing method of claim 11, further comprising the step of performing the logical operation in parallel between the single bits of the information.

DETAILED DESCRIPTION OF THE INVENTION

One embodiment of the present invention will be described below in accordance with accompanying drawings.

Figure 1:
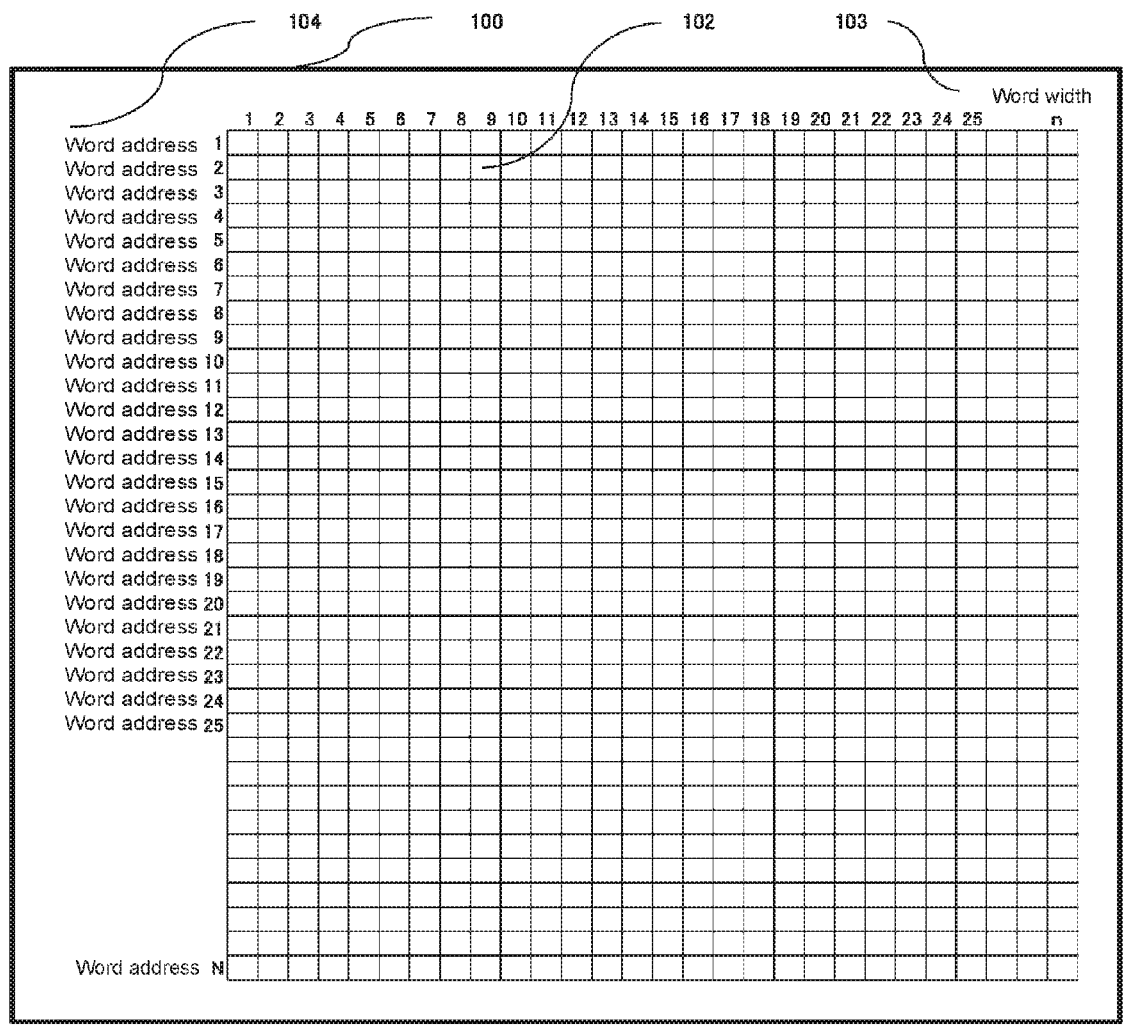
FIG. 1 is a structural view of a common memory.

FIG. 1 is a structural view showing a general memory according to this one embodiment.

In the memory 100 of FIG. 1, functional circuits such as an address decoder and a data bus are omitted, wherein this memory 100 is configured so that information data may be freely written into and read out of this memory, wherein this memory 100 consists of a storage cells 102 consisting of N×n bits of cells, wherein the storage cells 102 comprise N word addresses 104 with each word having a width 103 of n bits, and wherein generally the 1-N word addresses may be externally selected/specified with means such as an address decoder.

In the current information processing done by a CPU, the data width 103 of the memory 100 is a constant value such as 8 bits, 16 bits, 32 bits, etc., and for information data searches, the CPU sequentially accesses addresses in the memory's address space, reads data stored therein and serially processes the data, wherein a given number of addresses in the memory's address space is 1 M, 1 G, or the like.

Information processing by the memory of the present invention is based on a concept which defies the common sense of data width and address of the above general memory structure and database table structure, and is based on single-bit-based parallel logic operations.

Figure 2:
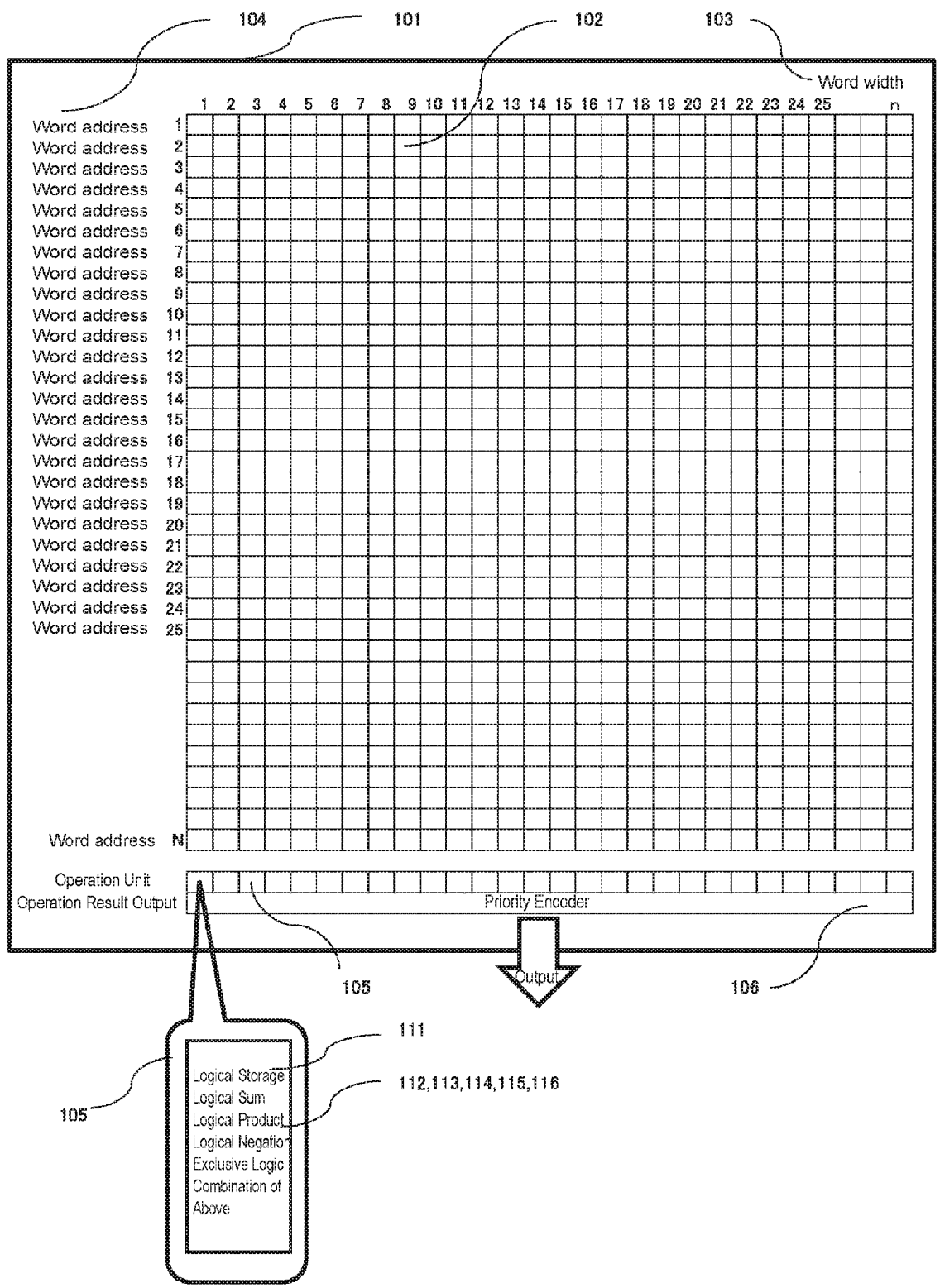
FIG. 2 is a structural view of a memory provided with an information search function.

FIG. 2 shows an example memory structure provided with an information search function according to the present invention.

Similarly, to FIG. 1, in FIG. 2, functional circuits such as an address decoder and a data bus are omitted, wherein this memory 101 is configured so that information data may be freely written into and read out of this memory, wherein this memory 101 consists of storage cells 102 consisting of N×n bits of cells, wherein the storage cells 102 comprise N word addresses 104 with each word having a width 103 of n bits, and wherein the 1-N word addresses may be externally selected/specified 110. The one word bit width of n 103 corresponds with a number of database records (n), and for the ease of understanding, one may analogously consider that each record is arranged as a column and N of the word address 104 corresponds to fields in each record.

In other words, this memory is a data table having n records with each record having N bits. A logical operation unit 105 is provided in parallel to n-bit storage cells 102 in this memory's row (horizontal) direction, which n-bit storage cells 102 may be selected/specified 110 using the word address 104, and this logical operation unit 105 is configured so that circuits capable of logical storage 116 for respective n-bit storage cells 102 of a selected/specified 110 word address 104, logical product 112, logical sum 113, logical negation (NOT) 114, exclusive logic 115 and combinations thereof may be freely specified.

Also, an operation result output 106 function of a priority address encoder output circuit or the like is provided in order to output operation results of this logical operation unit 105. This memory is mostly made of memory cells themselves and only small part of this memory is dedicated for the logical operation unit 105 and the operation result output 106 function, and therefore, by incorporating these functions in a miniscule area of respective general memories, those general memories may become high-capacity memories usable for databases.

Of course for faster operations, the memory may be adapted so that multiple word addresses may be selected/specified 110 simultaneously and multiple logical operation units 105 may be provided.

Next, an example is considered where the present invention is implemented with a DRAM. A current memory capacity per semiconductor die (chip) is about 8 Gbits.

With the assumption that the scale of circuits for the logical operation unit 105 and operation result output 106 functions is negligible, different combinations of the number of word addresses and the word width may be implemented for the main memory 101, for example, 1 M word addresses and 8 Kbit word width, or 8 K word addresses and 1 Mbit word width. This memory 101 may be effective for any information search, especially, big data search, data mining, genome analysis, etc., and some practical examples of this memory will be discussed below.

One example of our everyday search is an Internet search and its concept is embodied by information refinement using a keyword. For example, by providing a keyword such as "information processing," "information search" or "CPU," the search is refined and suitable Internet sites may be found.

Exemplary embodiments of utilizing this memory for publication search will be discussed below.

Example 1

Figure 3:
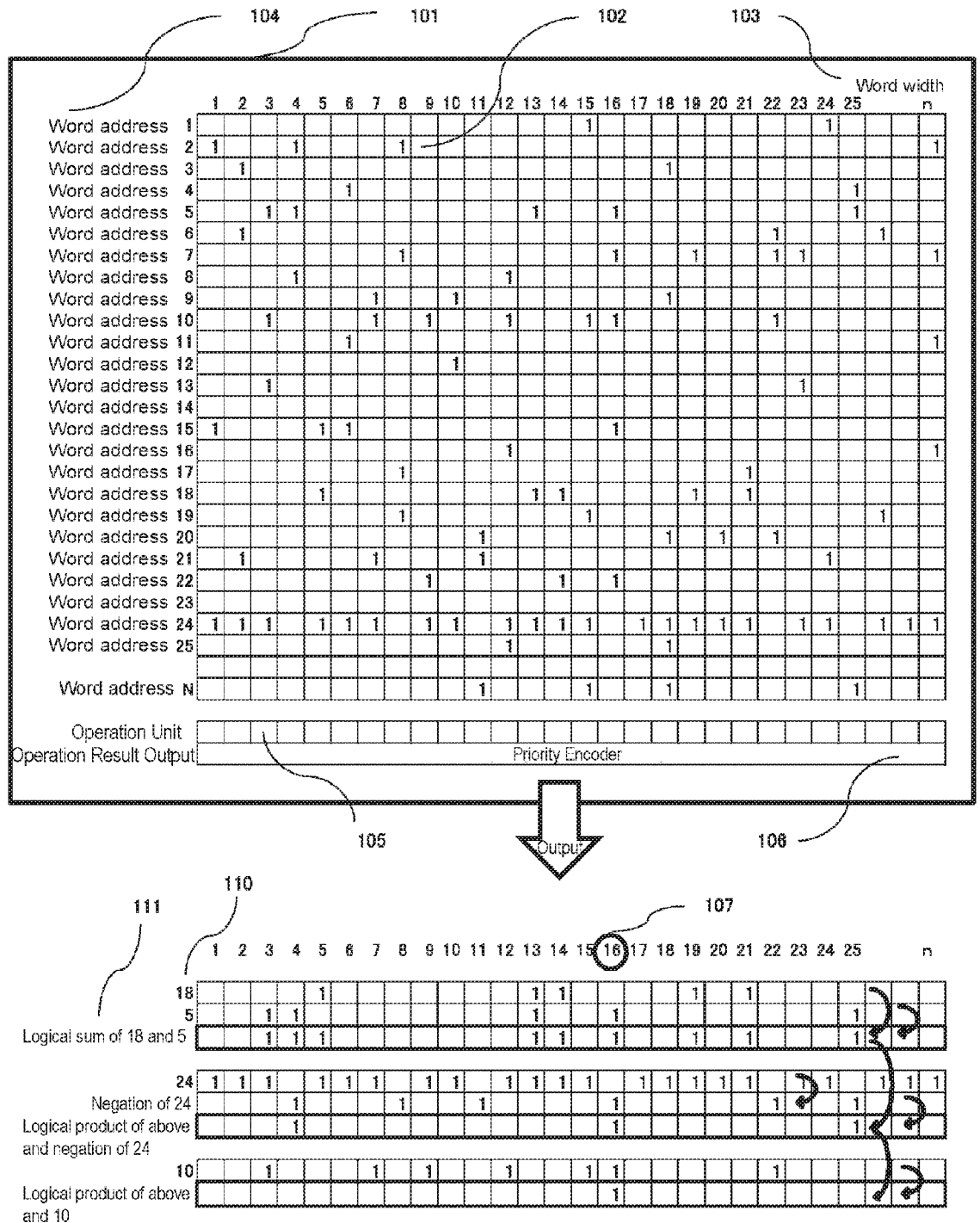
FIG. 3 is an example of publication search using the memory provided with the information search function (Example 1)

FIG. 3 shows an example of publication search using a memory provided with an information search function.

In this example, each of word addresses from 1 to N may be assigned to one vocabulary term such as "information processing," "information search," "patent" or "CPU," and each of vertical lines (columns) of word width n may be assigned to one publication. Also, the word addresses 1-N constitute one record as a whole, and the word addresses 1-N correspond to fields. In other words, if any of the terms including "information processing," "information search," "patent" and "CPU," exist in one publication, "1" will be written into memory cells (fields) corresponding to the existing terms ("0" is omitted and likewise hereafter). Therefore, in this example, N vocabulary terms and n publications (n records) are registered in a database.

An example of searching for a particular publication from within this stored database will be discussed below.

For registered database keywords, a word address 18 corresponds to "information processing," a word address 5 corresponds to "information search," a word address 24 corresponds to "patent" and a word address 10 corresponds to "CPU," wherein here we assume that the search operation formula is (publication(s) containing either "information processing" or "information search")×(publication(s) not containing "patent")×(publication(s) containing "CPU").

An operation process for the above keyword search is shown at the lower section of FIG. 3.

Records of publications containing either "information processing" of the word address 18 or "information search" of the word address 5 (logical sum (OR)) are records 3, 4, 5, 13, 14, 16, 19, 21 and 25. Next, records of publications not containing "patent" of the word address 24 are records 4, 8, 11, 16, 22 and 25, and taking a logical product (AND) between this logical negation operation 114 output and the previous operation output, i.e., publication records 3, 4, 5, 13, 14, 16, 19, 21 and 25 results in surviving publications 4, 16 and 25. Lastly, taking a logical product (AND) between publication records 3, 7, 9, 12, 15, 16 and 22 containing "CPU" of the word address 10 and the previous surviving publications records yields a final surviving publication 107 of record 16

As can be seen from the foregoing discussion, word addresses which have not been previously selected/specified 110 are ignored (Don't care) during in the course of operations, resulting in a similar effect to that of a content-addressable memory (CAM) with three values. That is, the publication 16 is a result of (publication(s) containing either "information processing" or "information search")×(publication(s) not containing "patent")×(publication(s) containing "CPU").

The above results may be sequentially read out from the operation result output 106 from a priority address encoder output circuit or the like.

The CPU may simply perform word address selection/specification 110 and operation specification 111 on this memory 101 to search for information of interest without having to search for the information through the entire memory space.

Although the above example was discussed on full-text searches, it may be utilized for a database for Internet search by populating the records with URLs.

Also, the above full-text searches were all done on single-bit-based data, but data subject to search will be values in the next exemplary embodiment below.

Example 2

Figure 4:
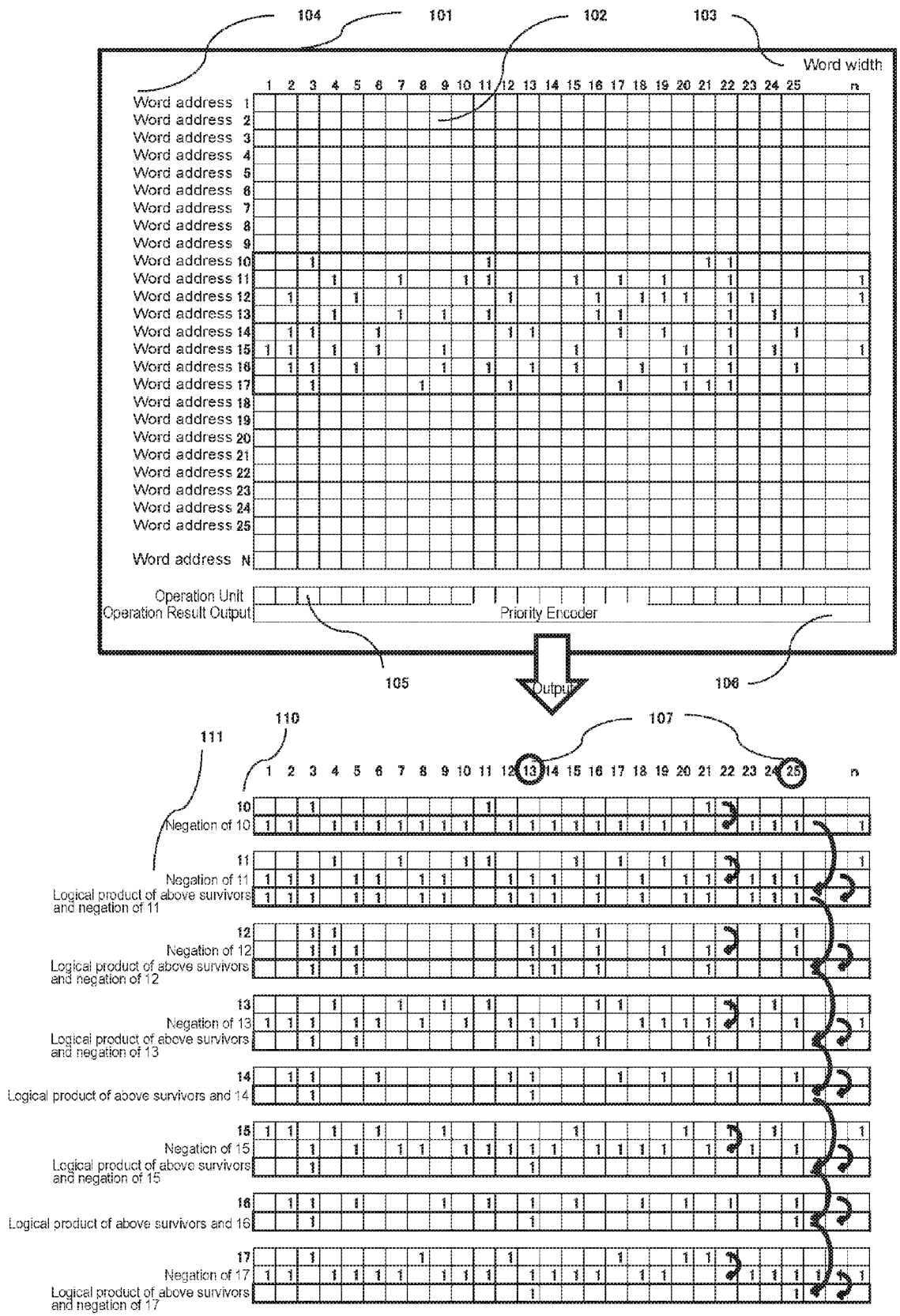
FIG. 4 is an example of exact match data search using the memory provided with the information search function (Example 2)

FIG. 4 shows an example of exact match data search using the memory provided with the information search function.

In this example, an 8-bit data is assigned to a field, wherein a word address 10 is the most significant bit (MSB) of the field and a word address 17 is the least significant bit (MSB) of the field. Since the data has 8 bits, it may store data in 256 different ways, allowing 256 ways of arbitrary searches from an exact match to a size comparison by properly selecting the eight word addresses from the word address 10 to the word address 17. For example, when performing the exact match search for a data value "10," which is "00001010" in binary, search may be performed eight times starting with the word address 10 as the most significant bit (MSB) and the word address 17 as the least significant bit (MSB).

As shown in the lower section of FIG. 4, the operation is sequentially performed from the MSB word address 10 in this example. In this case, "0" and "1" of "00001010" are searched with logical negation and positive logic, respectively, and logical product operations (tournament operations) are repeated eight times to obtain surviving two records 13 and 25, both of which has the data value "10." When incorporating adding and subtracting functions to the logical operation unit 105 for parallel operations, four arithmetic operations on record data will be available.

Example 3

Figure 5:
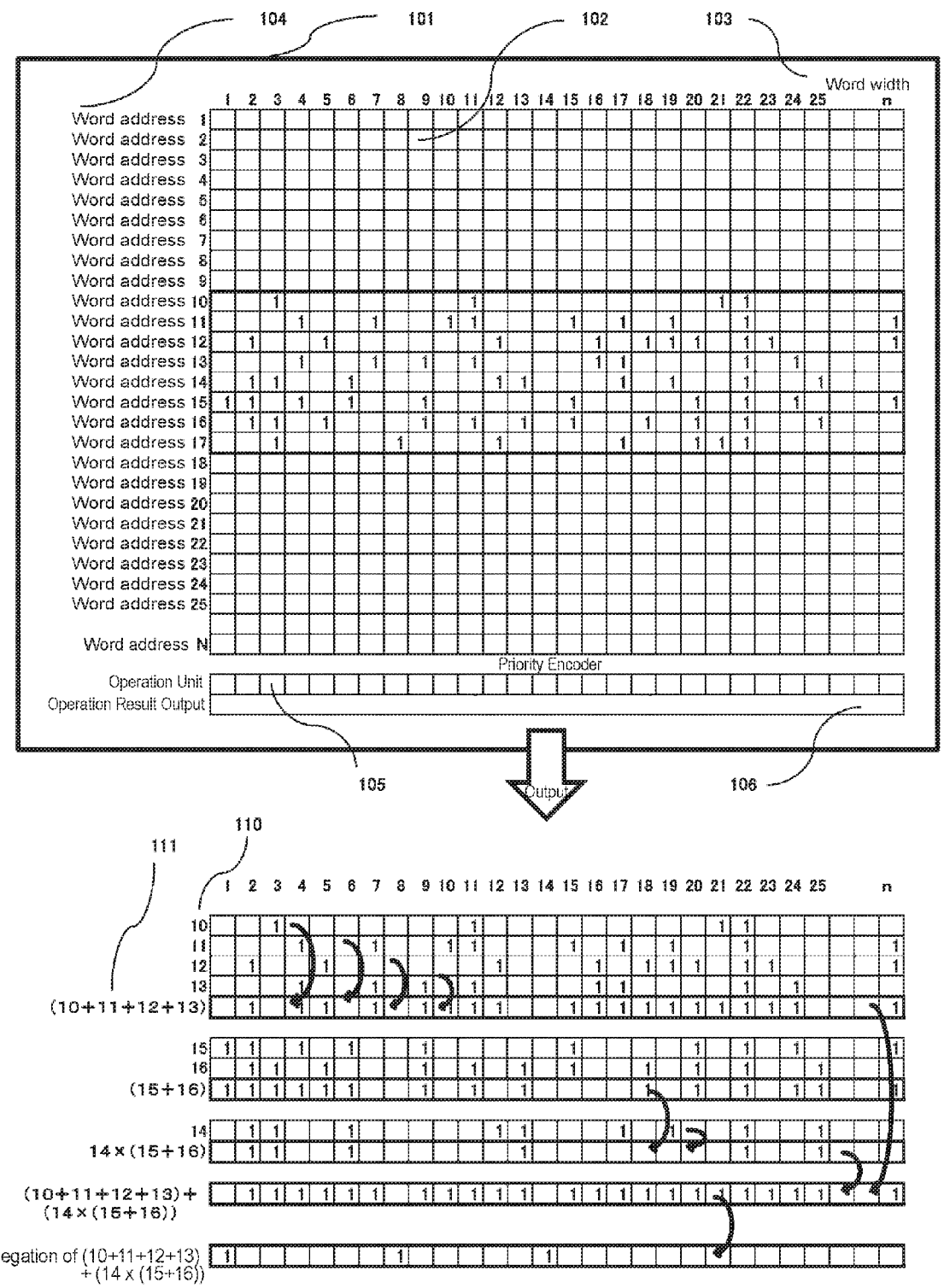
FIG. 5 is an example of range data search using the memory provided with the information search function (Example 3)

FIG. 5 shows an example of range data search using the memory provided with the information search function.

The above described the exact match search for the data value "10," but when searching for data values equal to or greater than "10," records with the data values equal to or greater than "16" may be detected by taking a logical sum four times from the MSB of the word address 10 to a word address 13, as shown in the figure. Additionally for the lower 4 bits, records with the data values equal to or greater than "10" and less than "16" may be obtained by taking a logical product between a logical sum of word addresses 15 and 16, and a word address 14; and records with the data value equal to or greater than "10" may be obtained by taking a logical sum of the records with the data value equal to or greater than "10" and less than "16" and the previously obtained records with the data value equal to or greater than "16." Further, by negating records with the data value equal to or greater than "10," records with the data value less than "10," i.e., equal to or less than "9" may be detected. Other data values or ranges may be searched by repeating single-bit-based operations analogous to the above.

The above operations may be performed about 10 times to generate results of all records processed in parallel. For 16-bit and 32-bit data values, it takes twice and four times as many operations of the above, respectively, to achieve the exact match or range searches. Also, operations may be kept extremely simple when the data width is increased from 8 bits to 9 bits or 10 bits, and the data width may be changed to even 17 bits, 33 bits, etc. with the word addresses not necessarily being continuous.

In other words, this memory has no limitation of in-field assignment as to searches for single-bit data with "1" or "0" to searches for a range with any data width.

In case of personal information as an example to show an important characteristic of this memory, information may be refined by searching for "males who live in Chiba, who work in Tokyo, who are 170 cm to 175 cm tall and who are 50 years old to 60 years old" for example, to thereby detect only required records. Considering that a large number of records are subject to searches, the memory may be configured to divide the operation result output 106 such as a priority address encoder output circuit into several blocks, and read out at per block basis.

Data may be written and read using a data bus with a constant width, and may be serially written and read using a first in, first out (FIFO) interface in vertical and horizontal directions. In this case, several operations may be processed in parallel.

Example 4

Figure 6:
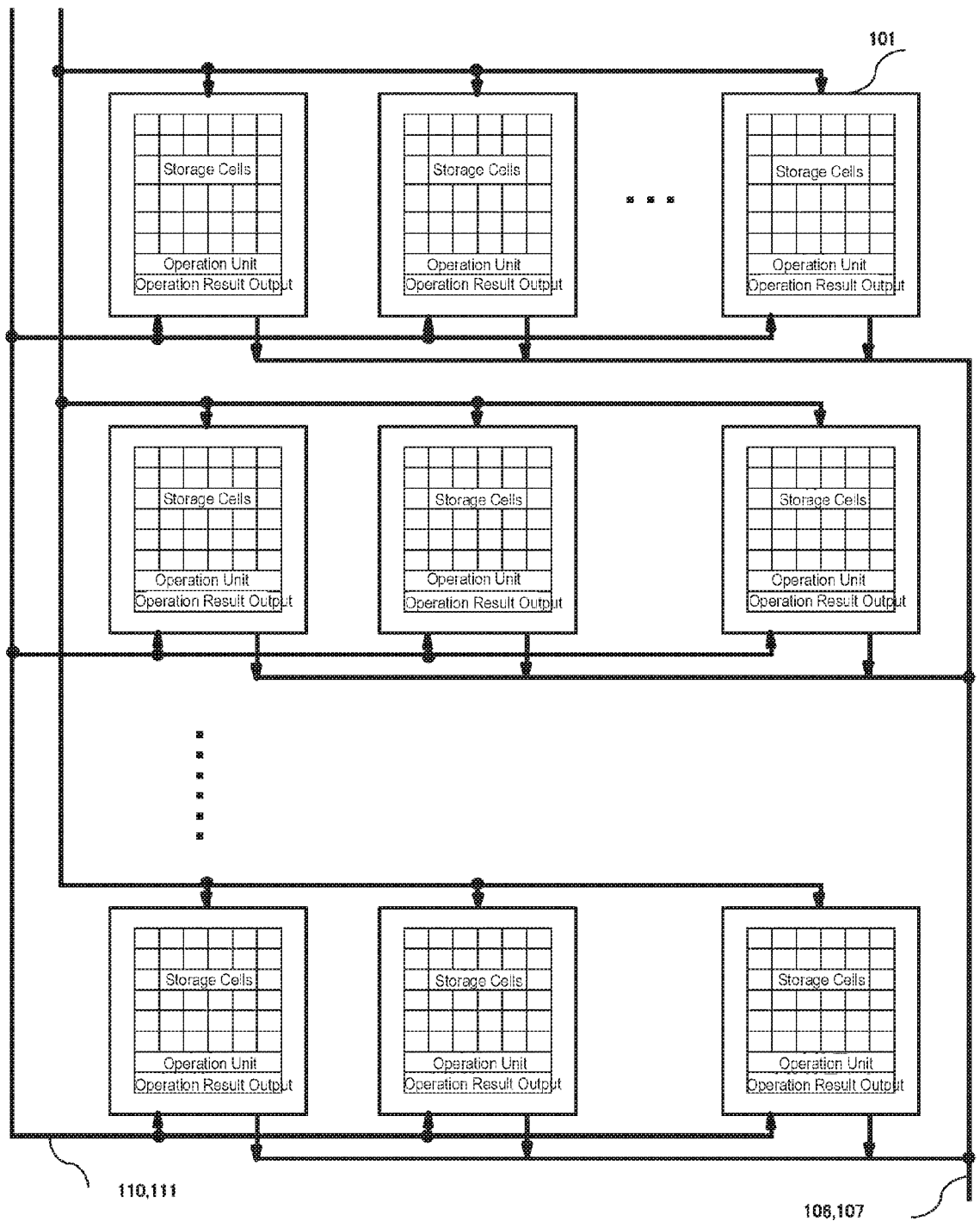
FIG. 6 is an example of serial and parallel connections of the memories each provided with the information search function (Example 4)

FIG. 6 shows an example of the present memories connected in series and parallel.

Each being fully independent, the present memories may be mutually connected to expand the system in the vertical (word address) direction and the horizontal (data width) direction to thereby allow extremely simple system expansion while providing durability to the system. According to a data type, required memory capacity is determined in the vertical (word address) direction and the horizontal (data width) direction. The required number of word addresses may be several hundred-thousands for the full-text search example discussed above, whereas it may be several thousands to several tens of thousands for the personal information example.

Usually, in order for one CPU to find particular information from a memory without any arrangement definitions or indices, it takes about 10 ms for 1 M word addresses, about 10 s for 1 G word addresses and about 10,000 s (about 3 hours) for 1 T word addresses just to access and match the memory contents at 10 ns/procedure. If CPUs are used in parallel with distributed processing, the processing time may be essentially reduced in inverse proportion to the number of CPUs. However, it is difficult to search through a massive database in realtime (e.g., within 1 second).

In the present example, the overall connected memory may be processed in parallel no matter how its data is arranged in serial and parallel even for 10 TB data, for example, by repeating the word address specification 110 and the operation specification 111 several times, several dozen times or several hundred times.

An access speed depends on a storage element, but if one logical operation takes 10 ns, for example, 100,000 operations may be possible within an information search time from several hundred ns, several μs to 1 ms. This fully parallel processing allows information search on any big data within a fixed amount of time from several hundred ns, several μs to about 1 ms, and that is the most important characteristic of the present technology.

The concept of the present invention reverses the conventional notion of memory structure and vertical and horizontal relationship of data, and clearly demonstrates that it can significantly reduce the number of information processing procedures and the processing time. This is extremely effective in data mining on big data, where searches have to be repeated based on various assumptions.

Example 5

Figure 7:
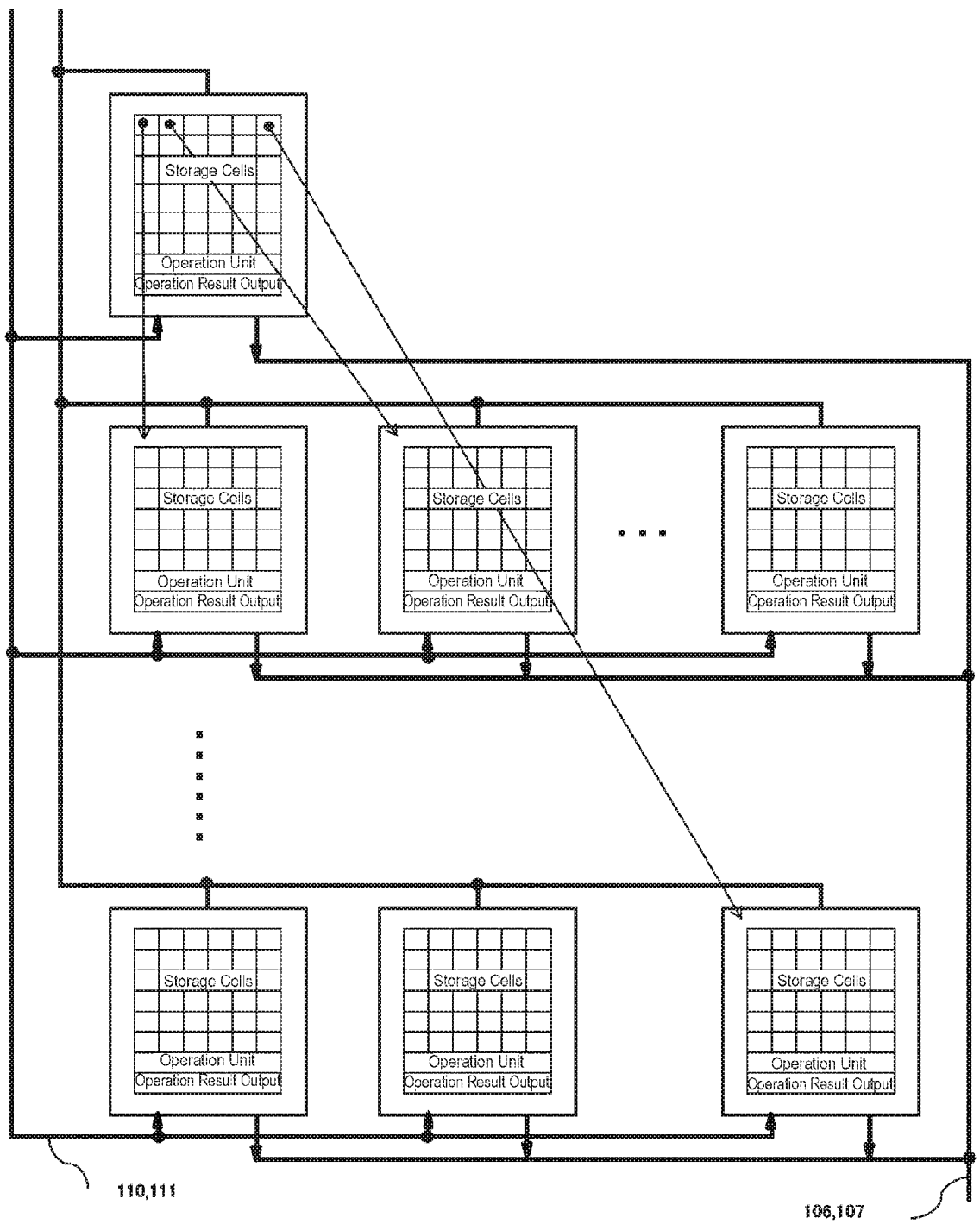
FIG. 7 is an example of hierarchical connections of the memories each provided with the information search function (Example 5).

FIG. 7 shows an example of hierarchical connections of the memories each provided with the information search function.

In the example of FIG. 7, a memory 101 at the top provided with the information search function is a master memory, and each of its records corresponds with more detailed data stored in respective sub memories, wherein the memory 101 is also provided with a sub information search function for the sub memories. In particular, big data of any scale may be searched by utilizing the above hierarchical database.

This memory 101 may be used to build a database by simply assigning its records and fields, and determining the operation specifications 111 for the logical operation units 105 to use the database. Therefore, this memory 101 eliminates the need for conventional search algorithms and database concepts themselves such as SQL and the like. For information search using a CPU, various techniques exist for reducing the CPU's load during its use. The binary search is one typical example of such techniques.

This algorithm is one of the most established information processing techniques as it can significantly reduce the number of information data searches, but it requires preprocessing such as arranging data in ascending order when writing data values in a data table on a memory, and also requires data rearrangement (data maintenance) on the memory every time data increases or decreases. That is, this algorithm reduces the CPU's load when it searches for a particular data value, but the load for the preprocessing and the data maintenance is never small.

The binary search has been discussed above, but other algorithms such as hash tables have similar problems.

With the present invention, the above algorithms become unnecessary, eliminating the need for information processing such as the preprocessing and the data maintenance. Data maintenance such as data rearrangement becomes entirely unnecessary because data may be registered or deleted by simply specifying the record(s) and/or field(s) to be registered or deleted. Therefore, a CPU for controlling the present memory 101 and the entire information processing does not need to be fast, allowing a significant reduction in information processing, especially electric power for information processing. As a result, the CPU load will be eliminated and technologies used for peripherals and information searches will be simplified.

The present inventor has been conducting research on various memory devices. Japanese Patent No. 4588114, "Memory Provided with Information Refinement Detection Function" discloses a memory with a strong capability of logical product operations such as pattern matching.

Also, PCT/JP2013/059260 "Memory Provided with Set Operation Function" discloses a memory capable of expanding the concept of the above memory provided with the information refinement detection function to thereby freely enable logical product operations, logical sum operations and logical negation operations, etc.

The foregoing inventions are both applied technologies based on the content-addressable memory (CAM) and capable of utilizing the present invention.

As an example, by combining the logical operation unit 105 with a shift register function, a memory provided with an information refinement detection function, or a memory provided with a set operation function may be realized.

Compared to typical content-addressable memories (CAMs), the present scheme has a somewhat reduced speed of parallel operations themselves, but it can implement a large-scale equivalent content-addressable memory (CAM) to thereby dramatically reduce the processing time of overall information search.

Such a memory 101 is exceptionally effective for genome analysis. Among others, human DNA has big data of several G base information. Analyses on such big data require extremely long time. If several G base information is stored in this memory 101, its DNA analysis will be faster and more accurate than using a supercomputer. In the current information processing, the data width of the memory 100 is a constant value such as 32 bits, 64 bits, 128 bits, etc., and a CPU sequentially accesses addresses, reads data stored therein and serially processes the data. Information processing efficiency increases as the data width (bus width) widens, but at the same time, the number of device I/O pins and wiring load of the printed circuit board implementing the device increase as well, and therefore there is a limit to how wide the data bus width can be.

As one of the characteristics of the memory 101 of the present invention, it vertically and horizontally reverses the conventional concept of memory structure and information processing for a database, and performs single-bit-based parallel operations. Even with single-bit-based operations, if parallel information processing can be done on massive storage cell 102 information, such information processing will be extremely efficient with its significantly reduced number of operations compared to conventional techniques, and further, as one of the characteristics of memory devices, information in a memory chip does not have to be externally retrieved, but instead may be internally processed by driving a large number of memory cells in parallel, entering (substituting) the information in the parallel logical operation units and performing parallel operations within the memory chip.

The present memory may be implemented in conventional DRAMs, SRAMs and flash memories as well as magnetic storage memory cells, which have been actively researched recently for their nonvolatile, power-saving features, by adding logical operation functions to only a small part of the chips, thus enabling massive, super fast and simple information processing.

Algorithms of this memory 101 may be easily implemented in FPGAs.

This memory, provided with an in-memory database and a self-search function independent of a CPU, may be also combined with a CPU into an integrated device configuration.

Since before, the content-addressable memory (CAM) has been know as a device having a fast operation function, and various applications have been studied including various knowledge processing, but it is used for only limited purposes such as a communication router for reasons including its inability to have a large storage capacity and its high power consumption.

Since the present invention is a novel type of information processing memory having a large capacity and an information search speed comparable to that of the content-addressable memory (CAM), it has a wide variety of applications such as various databases, data mining of big data, data analysis and knowledge processing.

Also, since this technology may be used to dramatically reduce the power consumption of information processing, it has a great significance in eliminating environmental problems caused by ICT equipment and it will be one of novel information processing techniques.

What is claimed is:

1. A data processing device for performing search operations on field data of 2 or more records that constitute a database and outputting results of the search operations, the data processing device comprising a memory, a single-bit logical operation circuit connected to the memory and an output circuit for outputting a logical operation result obtained by the single-bit logical operation circuit, wherein, in the memory, data of a specific field of each record is coded by bit data ("0" or/and "1") having a bit width corresponding to a data length of the field, and is stored at respective word addresses, wherein the number of the word addresses corresponds to the bit width, wherein, when the single-bit logical operation circuit performs, as an operation to data of a specific field of each record, an operation of an operation condition that specifies a condition including a detection of a record where field data matches a specific operation condition value or a detection of a record in which field data falls in a specific range of operation condition values, the single-bit logical operation circuit reads bit values stored at a same word address for all records in parallel, performs single-bit logical operations in parallel at all records according to an operation condition, and outputs single-bit logical operation results to the operation result output circuit as bit values of all records, and wherein the operation result output circuit comprises a unit for identifying a record whose bit value of the operation result is 1 and outputting the identified result as an operation processing result.

2. The data processing device of claim 1, wherein the memory is a storage cell structure having n records and N word addresses, that is N×n bits.

3. The data processing device of claim 1, wherein in the single-bit operation circuit, the operation condition may be expressed with single-bit-based logical storage, logical product, logical sum, logical negation, exclusive logic or any combinatorial logical condition thereof, and the logical condition identifies with a bit value 1, a record whose value matches a specific value and a record whose value falls within a specified range.

4. The data processing device of claim 3, wherein the single-bit operation circuit comprises a shift register function.

5. The data processing device of claim 1, wherein the data processing device uses the memory in serial, parallel or hierarchical connection.

6. The data processing device of claim 1, wherein the database has at least one specific field having a data length of 2 bits or more in each record.

7. A data processing method for performing search operations on a value included in specific field data of 2 or more records that constitute a database and outputting results of the search operations, the data processing method employs a data processing device comprising a memory, a single-bit logical operation circuit connected to the memory and an output circuit for outputting a logical operation result obtained by the single-bit logical operation circuit, the data processing method comprising the steps of:

coding, in the memory, data of a specific field of each record using bit data ("0" or/and "1") having a bit width corresponding to a data length of the field; and storing the bit data at word respective addresses, wherein the number of the word addresses corresponds to the bit width;

when the single-bit logical operation circuit performs, as an operation to data of a specific field of each record, an operation of an operation condition including a detection of a record where field data matches a specific operation condition value or a detection of a record in which field data falls in a specific range of operation condition values; reading, by the single-bit logical operation circuit, bit values stored at a same word address for all records in parallel; performing single-bit logical operations in parallel at all records according to an operation condition; and outputting single-bit logical operation results to the operation result output circuit as bit values of all records; and identifying, by the operation result output circuit, a record whose bit value of the operation result is 1; and outputting the identified result as an operation processing result.

8. The data processing method of claim 7, wherein the memory is a storage cell structure with n records and N word addresses, that is N×n bits.

9. The data processing method of claim 7, wherein in the single-bit operation circuit, the operation condition may be expressed with single-bit-based logical storage, logical product, logical sum, logical negation, exclusive logic or any combinatorial logical condition thereof, and the logical condition identifies with a bit value 1, a record whose value matches a specific value and a record whose value falls within a specified range.

10. The data processing method of claim 9, wherein the single-bit operation circuit comprises a shift register function.

11. The data processing method of claim 7, wherein the data processing device uses the memory in serial, parallel or hierarchical connection.

12. The data processing method of claim 7, wherein the database has at least one specific field having a data length of 2 bits or more in each record.

* * * * *